United States Patent
Wakuda et al.

(10) Patent No.: US 9,814,134 B2
(45) Date of Patent: Nov. 7, 2017

(54) ELASTIC FLEXIBLE SUBSTRATE AND MANUFACTURING METHOD THEREOF

(71) Applicant: Panasonic Intellectual Property Management Co., Ltd., Osaka (JP)

(72) Inventors: Daisuke Wakuda, Osaka (JP); Tetsuyoshi Ogura, Osaka (JP); Takashi Matsumoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 144 days.

(21) Appl. No.: 14/626,935

(22) Filed: Feb. 20, 2015

(65) Prior Publication Data
US 2015/0282294 A1 Oct. 1, 2015

(30) Foreign Application Priority Data
Mar. 31, 2014 (JP) .................................. 2014-073566

(51) Int. Cl.
| H05K 1/00 | (2006.01) |
| H05K 1/02 | (2006.01) |
| H05K 1/11 | (2006.01) |
| H05K 1/18 | (2006.01) |
| H05K 3/10 | (2006.01) |

(52) U.S. Cl.
CPC ........... *H05K 1/028* (2013.01); *H05K 1/0274* (2013.01); *H05K 1/115* (2013.01); *H05K 1/118* (2013.01); *H05K 1/181* (2013.01); *H05K 3/103* (2013.01); *H05K 1/189* (2013.01); *Y10T 29/49162* (2015.01)

(58) Field of Classification Search
CPC ........ H05K 1/025; H05K 1/0224; H05K 7/02; H01B 7/0861
USPC .................. 174/250–258, 117 F, 117 FF; 361/749–750, 760–761, 776
See application file for complete search history.

(56) References Cited

U.S. PATENT DOCUMENTS

| 5,334,800 A * | 8/1994 | Kenney ................ H05K 1/0224 174/250 |
| 5,682,124 A * | 10/1997 | Suski ...................... H01P 3/081 174/254 |
| 7,541,678 B2 * | 6/2009 | Nishida .................. H05K 1/025 257/758 |
| 2010/0101853 A1 * | 4/2010 | McNutt .................. H01B 13/26 174/350 |
| 2011/0094790 A1 * | 4/2011 | Lin ........................ H05K 1/028 174/350 |

(Continued)

FOREIGN PATENT DOCUMENTS

| JP | 1-135758 U | 9/1989 |
| JP | 2-244788 A | 9/1990 |

(Continued)

*Primary Examiner* — Tuan T Dinh
(74) *Attorney, Agent, or Firm* — McDermott Will & Emery LLP (57) ABSTRACT

An elastic flexible substrate includes an insulating base material having a first insulating film and a second insulating film, and a plurality of wires, each of which is disposed on one of the first insulating film and the second insulating film. The insulating base material has a plurality of bonding portions that are surface-bonded, openings are formed between the bonding portions, and two of the plurality of wires are electrically connected in the bonding portions.

18 Claims, 8 Drawing Sheets

(56) References Cited

U.S. PATENT DOCUMENTS

2012/0285723 A1* 11/2012 Gundel ................ H01B 7/0861
    174/113 R
2013/0301196 A1* 11/2013 Miyazaki ................ H05K 7/02
    361/679.01

FOREIGN PATENT DOCUMENTS

| JP | 6-140727 | 5/1994 |
| JP | 2002-057416 A | 2/2002 |
| JP | 2009-224508 | 10/2009 |

* cited by examiner

ELASTIC FLEXIBLE SUBSTRATE AND MANUFACTURING METHOD THEREOF

CROSS REFERENCES TO RELATED APPLICATIONS

This application claims priority to Japanese Patent Application No. 2014-073566, filed on Mar. 31, 2014, the contents of which are hereby incorporated by reference.

BACKGROUND

1. Technical Field

The present disclosure relates to an elastic flexible substrate and a manufacturing method thereof. More specifically, the present disclosure relates to an elastic flexible substrate that can be used as a circuit board, and also to a method of manufacturing such an elastic flexible substrate.

2. Description of the Related Art

As electronic devices have been made smaller and thinner, flexible substrates have been used in various types of electronics equipment. Such flexible substrates are often used in a bent state from the viewpoint of space saving, have a thin overall form, and have flexibility.

In recent years, flexible substrates have been expected to be used in various fields. The use of flexible substrates has been considered not only in categories of conventional electronics equipment fields, but also in fields such as wearable devices, robots, and further, healthcare, medical care, and nursing care. For example, flexible substrates have been expected to be used also in applications in which sensors are arranged on free-form surfaces such as palmar surfaces, applications in which sensors are used in touch panels that have a relatively large curved form such as a "spherical surface", and further, applications in which sensors are built into clothing items and the like that are bent and expanded/contracted whenever used.

Japanese Unexamined Patent Application Publication No. 6-140727, Japanese Unexamined Patent Application Publication No. 2009-224508, and Japanese Unexamined Utility Model Registration Application Publication No. 1-135758 are examples of related art.

SUMMARY

One non-limiting and exemplary embodiment provides an elastic flexible substrate in which an expanding/contracting direction is not limited to one direction and a twist does not occur, and a manufacturing method thereof.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature an elastic flexible substrate including an insulating base material and a wire disposed on the insulating base material. The insulating base material has a plurality of bonding portions that are surface-bonded, and openings are formed between the bonding portions.

According to the one aspect, in an elastic flexible substrate of the present disclosure, an expanding/contracting direction is not limited to one direction and a twist does not occur.

These general and specific aspects may be implemented using a system, a method, and a computer program, and any combination of systems, methods, and computer programs.

DETAILED DESCRIPTION

<Underlying Knowledge Forming Basis of the Present Disclosure>

In the description of embodiments of the present disclosure, the matters considered by the disclosers will first be described.

As for an elastic flexible substrate in a conventional configuration (see Japanese Unexamined Patent Application Publication No. 6-140727, for example), a slit crossing a movement direction of a conductive pattern is formed, and the slit is widened so that the relevant flexible printed circuit board is elongated in the movement direction of the conductive pattern. Therefore, there is a problem in that expansion/contraction is impossible in a direction parallel to the slit formed in the board and an expanding/contracting direction is limited in the board surface.

Moreover, as for an elastic flexible substrate in a conventional configuration (see Japanese Unexamined Patent Application Publication No. 2009-224508, for example), a displacement generated by twisting the substrate contributes to elongation of the entire substrate. Therefore, there is a problem in that a twist always occurs upon expansion/contraction.

The present disclosure is made in view of such problems, to provide an elastic flexible substrate in which an expanding/contracting direction is not limited to one direction and a twist does not occur, and a manufacturing method thereof.

<Elastic Flexible Substrate of the Present Disclosure>

An elastic flexible substrate according to one embodiment of the present disclosure will now be described with reference to the drawings. It should be noted that the various elements in the drawings are only schematically illustrated for the sake of the understanding of the present disclosure and may differ from actual elements in terms of a dimensional ratio, appearance, and so on.

First, an elastic flexible substrate of one embodiment of the present disclosure will be outlined.

The most significant feature of the elastic flexible substrate of one embodiment of the present disclosure is that an insulating base material 3, which is a component of the elastic flexible substrate, includes a plurality of bonding portions that are "surface-bonded" and openings are formed between the bonding portions. With this feature, the present disclosure can provide a flexible substrate that is not only free from twists but also freely expandable or contractible.

Next, an elastic flexible substrate 1 of a first embodiment of the present disclosure will be described in detail.

Figure 1:
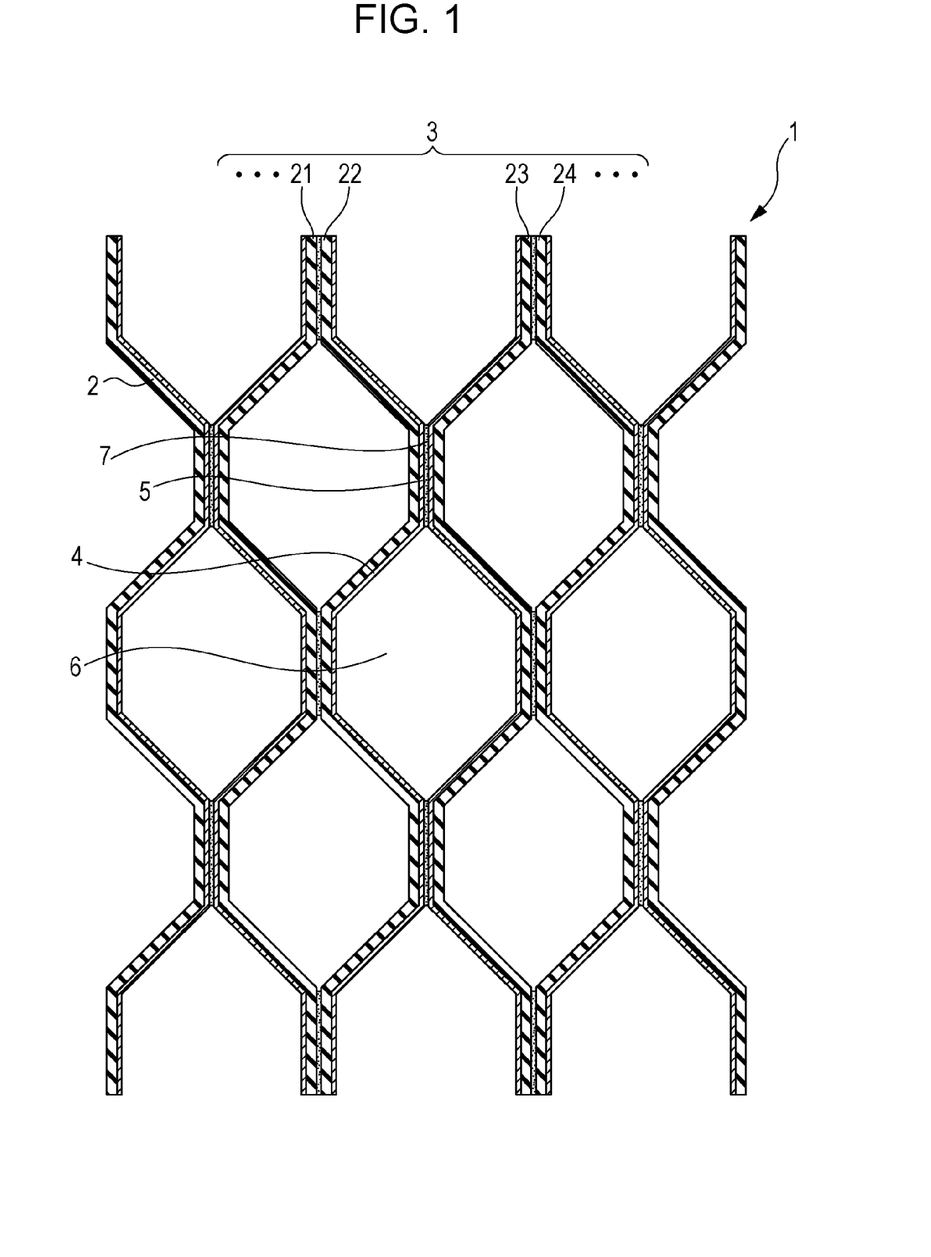
FIG. 1 is a partial schematic plan view of an elastic flexible substrate of a first embodiment of the present disclosure.
Figure 2A:
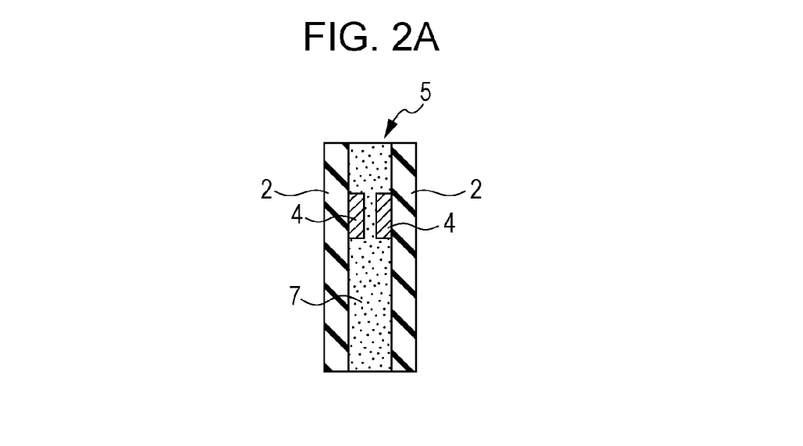
FIGS. 2A to 2C are enlarged schematic section views of bonding portions in the elastic flexible substrate of the first embodiment of the present disclosure.
Figure 2B:
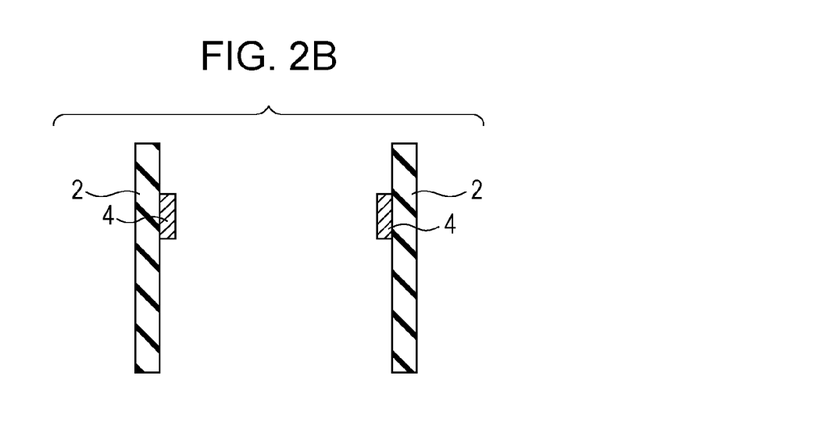
Figure 2C:
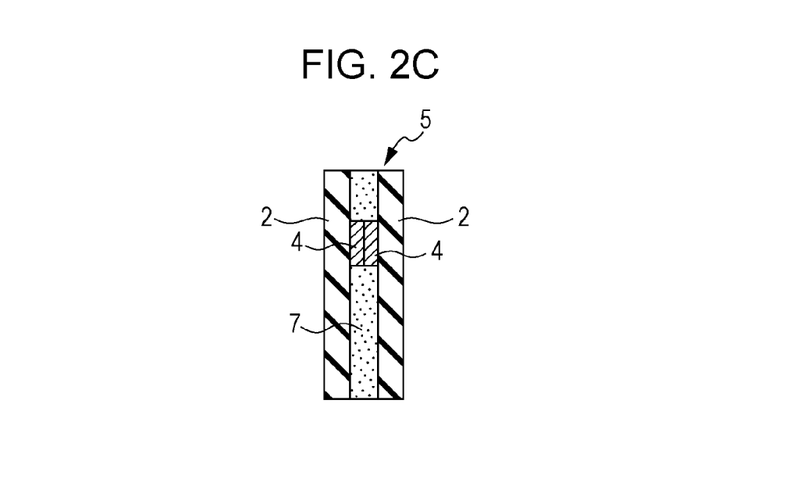

FIG. 1 is a partial schematic plan view of the elastic flexible substrate 1 of the first embodiment of the present disclosure. FIGS. 2A to 2C are enlarged schematic section views of bonding portions 5 in the elastic flexible substrate 1 of the first embodiment of the present disclosure.

The elastic flexible substrate 1 of the first embodiment of the present disclosure includes the insulating base material 3 configured with a plurality of insulating films 2, and a wire 4 disposed on the insulating base material 3. The wire 4 is disposed along a longitudinal direction of each insulating film 2; for example, each wire 4 is disposed on an inner principal surface of each insulating film 2. In the following description of this embodiment, among the plurality of insulating films 2 in FIG. 1, the focus is on a first insulating film 21, a second insulating film 22, a third insulating film 23, and a fourth insulating film 24. The first insulating film 21 to the fourth insulating film 24 are opposed, and the first insulating film 21 and the second insulating film 22 are surface-bonded at a plurality of places at predetermined intervals through, for example, an adhesive 7. Further, the second insulating film 22 is surface-bonded to the third insulating film 23 between the adjacent bonding portions 5 bonded to the first insulating film 21. Moreover, the third insulating film 23 is surface-bonded to the fourth insulating film 24 between the adjacent bonding portions 5 bonded to the second insulating film 22. In this way, the plurality of insulating films 2 are bonded such that the bonding portions 5 between the adjacent insulating films 2 are staggered. When a force is exerted to elongate the insulating base material 3, which is formed of the plurality of insulating films 2 thus bonded, in a direction orthogonal to the longitudinal direction of the insulating films 2, an opening 6 is formed between each pair of the bonding portions 5 and the insulating base material 3 can be extended. When a force is exerted to elongate the insulating base material 3 in parallel with the longitudinal direction of the insulating films 2 while the openings 6 are formed, the insulating base material 3 is deformed in a direction in which the openings 6 are closed, and can be extended in the longitudinal direction of the insulating films 2. That is, with reference to a state shown in FIG. 1, in which the openings 6 are formed between the bonding portions 5, the insulating base material 3 can be extended both in the longitudinal direction of the insulating films 2 and in the direction orthogonal to the longitudinal direction, and further, can be extended in an oblique direction inclined with respect to the longitudinal direction of the insulating films 2.

In the elastic flexible substrate 1 thus configured, each opening 6 has a substantially hexagonal shape (hexagonal column shape in consideration of the insulating film width) divided by a partition that is formed of the insulating films 2 including two bonding portions 5 opposed to each other at an interval. That is, the elastic flexible substrate 1 of the first embodiment includes the insulating base material 3 in a honeycomb structure with a tight arrangement of the plurality of substantially hexagonal column-shaped openings 6 surrounded by the partitions that include the opposed bonding portions 5. When a force is exerted on the insulating base material 3 thus configured, so as to elongate the insulating base material 3 in a direction parallel to a horizontal plane orthogonal to axes of the hexagonal column-shaped openings 6, the insulating base material 3 can be expanded/contracted in a direction corresponding to the exerted force as described above, but no force is exerted in the axial direction of the openings 6 at that time. This enables the elastic flexible substrate 1 to be expanded/contracted without causing a twist in the elastic flexible substrate 1.

Examples of the insulating film base material 2 include a polyimide resin, PET resin, PEN resin, or liquid crystal polymer, or a combination thereof. The "wire 4" generally forms a conductor circuit. There is no specific limitation on a material of the wire 4, provided that the material has conductivity. Examples of the material of the wire 4 may include a metal material such as gold (Au), silver (Ag), copper (Cu), aluminum (Al), nickel (Ni), chrome (Cr), cobalt (Co), magnesium (Mg), calcium (Ca), platinum (Pt), molybdenum (Mo), iron (Fe), and/or zinc (Zn) or a conductive oxide material such as zinc oxide (ZnO), tin oxide ($SnO_2$), indium tin oxide (ITO), fluorine-containing zinc oxide (FTO), ruthenium oxide ($RuO_2$), iridium oxide ($IrO_2$), and platinum oxide ($PtO_2$), and further, a conductive polymer material such as polythiophene and polyaniline materials.

In the first embodiment, for example, as illustrated in FIG. 2A, the bonding portion 5 has two insulating films 2 bonded through the adhesive 7. When an adhesive bonding method is adopted in this way, the wire on one of the insulating films 2 bonded in the bonding portion 5 and the wire on the other insulating film 2 may be electrically bonded, or may be bonded in an electrically separated manner. For example, FIG. 2A illustrates an example in which the insulating films 2 are bonded while the wires are electrically separated, and FIG. 2C illustrates an example in which the insulating films 2 are bonded while the wires are electrically connected.

As illustrated in FIG. 2B, in the opening 6 between the bonding portions 5, the wire on one of the insulating films 2 forming the opening 6 and the wire on the other insulating film 2 are electrically separated.

The surfaces of the wires on the insulating films 2 forming the opening 6 may be covered with an insulating protective material.

As described above, according to the first embodiment of the present disclosure, it is possible to provide the elastic flexible substrate 1 that can be extended in two directions orthogonal to each other and in any direction other than the two directions.

Next, an elastic flexible substrate 1A of a second embodiment of the present disclosure will be described in detail.

Figure 3:
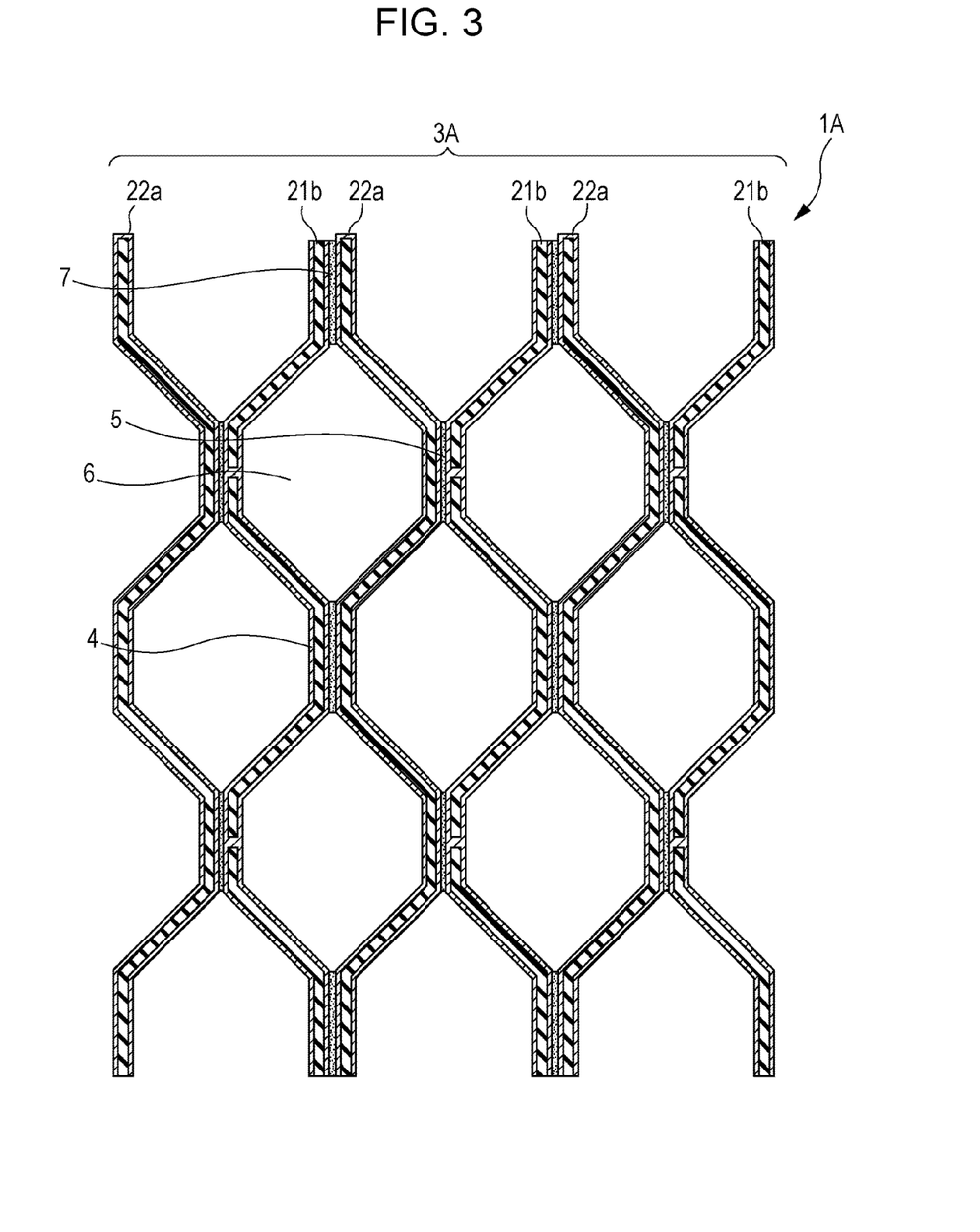
FIG. 3 is a partial schematic plan view of an elastic flexible substrate of a second embodiment of the present disclosure.
Figure 4A:
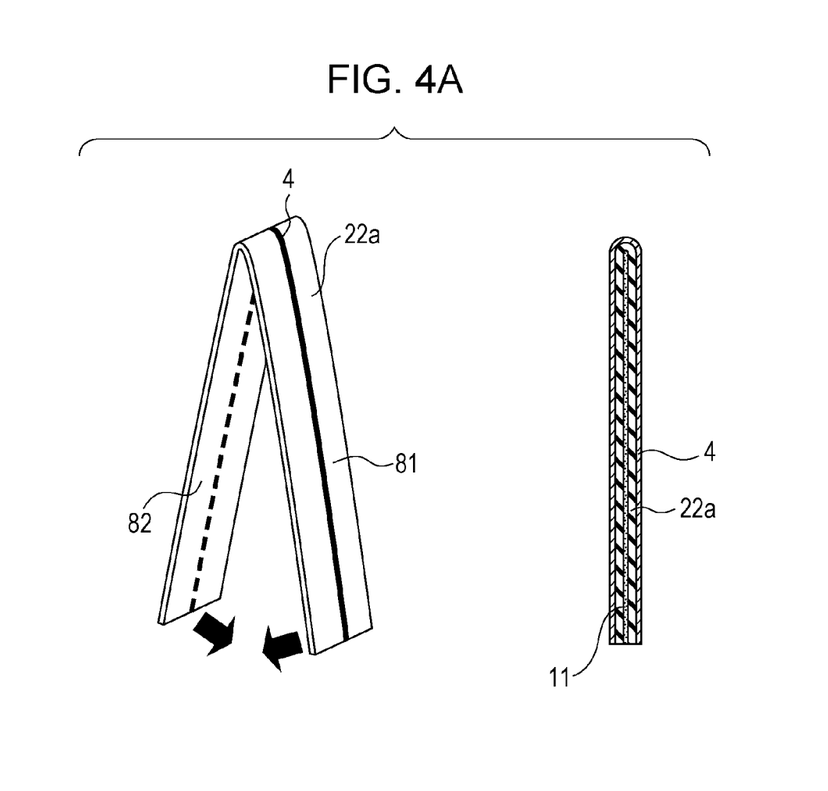
FIGS. 4A and 4B are enlarged schematic plan views of insulating films with wires.
Figure 4B:
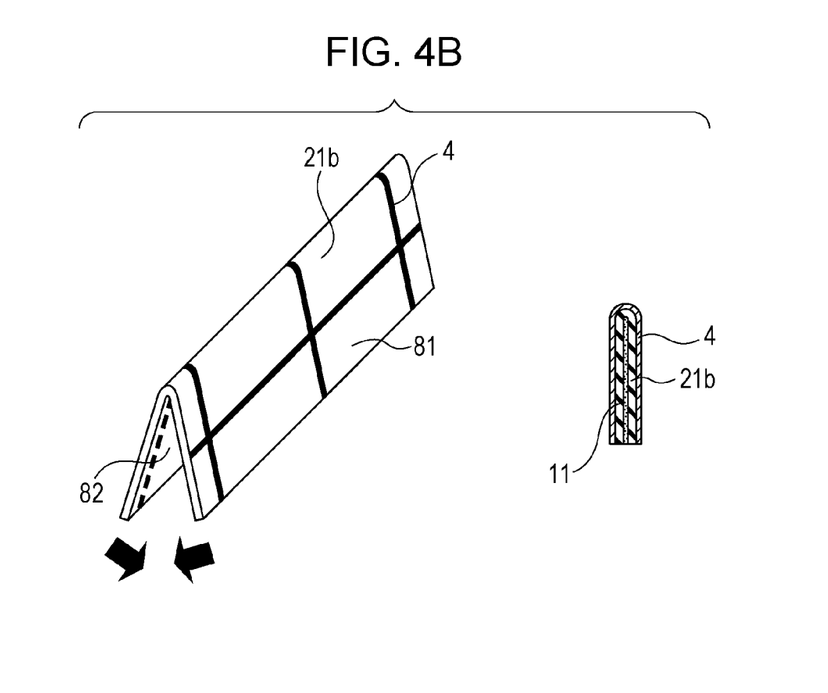

FIG. 3 is a partial schematic plan view of the elastic flexible substrate 1A of the second embodiment of the present disclosure. FIG. 4A is an enlarged schematic plan view of an insulating film 22a with the wire 4. FIG. 4B is an enlarged schematic plan view of an insulating film 21b with the wire 4.

The elastic flexible substrate 1A of the second embodiment of the present disclosure is different from the first embodiment in that the elastic flexible substrate 1A is configured with an insulating base material 3A formed of two types of insulating films each different from the insulating films in the first embodiment. The elastic flexible substrate 1A is, however, similar to the first embodiment in that a plurality of insulating films are bonded such that the bonding portions 5 between adjacent insulating films are staggered.

The two types of insulating films for use in the second embodiment will now be described. In the second embodiment, one of the two types of insulating films is referred to as a first insulating film 22a and the other is referred to as a second insulating film 21b.

In the second embodiment, as illustrated in FIG. 4A, the first insulating film 22a is a ribbon-shaped insulating film having the wire 4 disposed on a first principal surface 81, a constant width, and a length that is sufficiently long in a longitudinal direction with respect to the width. The first insulating film 22a is folded along the center line orthogonal to the longitudinal direction while a second principal surface 82 opposed to the first principal surface 81 faces inward, and the opposed portions of the second principal surface 82 are bonded together through an adhesive layer 11. In the first insulating film 22a, the wire 4 is disposed on the first principal surface 81 as illustrated in FIG. 4A. In the first insulating film 22a, the wire 4 is disposed on the first principal surface 81 along the longitudinal direction of the insulating film.

In the second embodiment, as illustrated in FIG. 4B, the second insulating film 21b is a ribbon planar insulating film having a width twice the width of the first insulating film 22a and a length that is sufficiently long in a longitudinal direction with respect to the width. The second insulating film 21b is folded along the center line parallel to the longitudinal direction while the second principal surface 82 opposed to the first principal surface 81 faces inward, and the opposed portions of the second principal surface 82 are bonded together through the adhesive layer 11. In the second insulating film 21b, the wire 4 is disposed on the first principal surface 81 as illustrated in FIG. 4B.

As described above, in the second embodiment, the first insulating film 22a is folded along the central axis orthogonal to the longitudinal direction of the first insulating film 22a such that the first principal surface 81 faces outward and the second principal surface 82 faces inward. The second insulating film 21b is folded along the central axis parallel to the longitudinal direction of the second insulating film 21b such that the first principal surface 81 faces outward and the second principal surface 82 faces inward. However, the present disclosure is not limited to this; an elastic flexible substrate may be configured with a plurality of first insulating films 22a without using the second insulating film 21b, or may be configured with a plurality of second insulating films 21b without using the first insulating film 22a.

Next, an elastic flexible substrate 1B of a third embodiment of the present disclosure will be described in detail.

Figure 5:
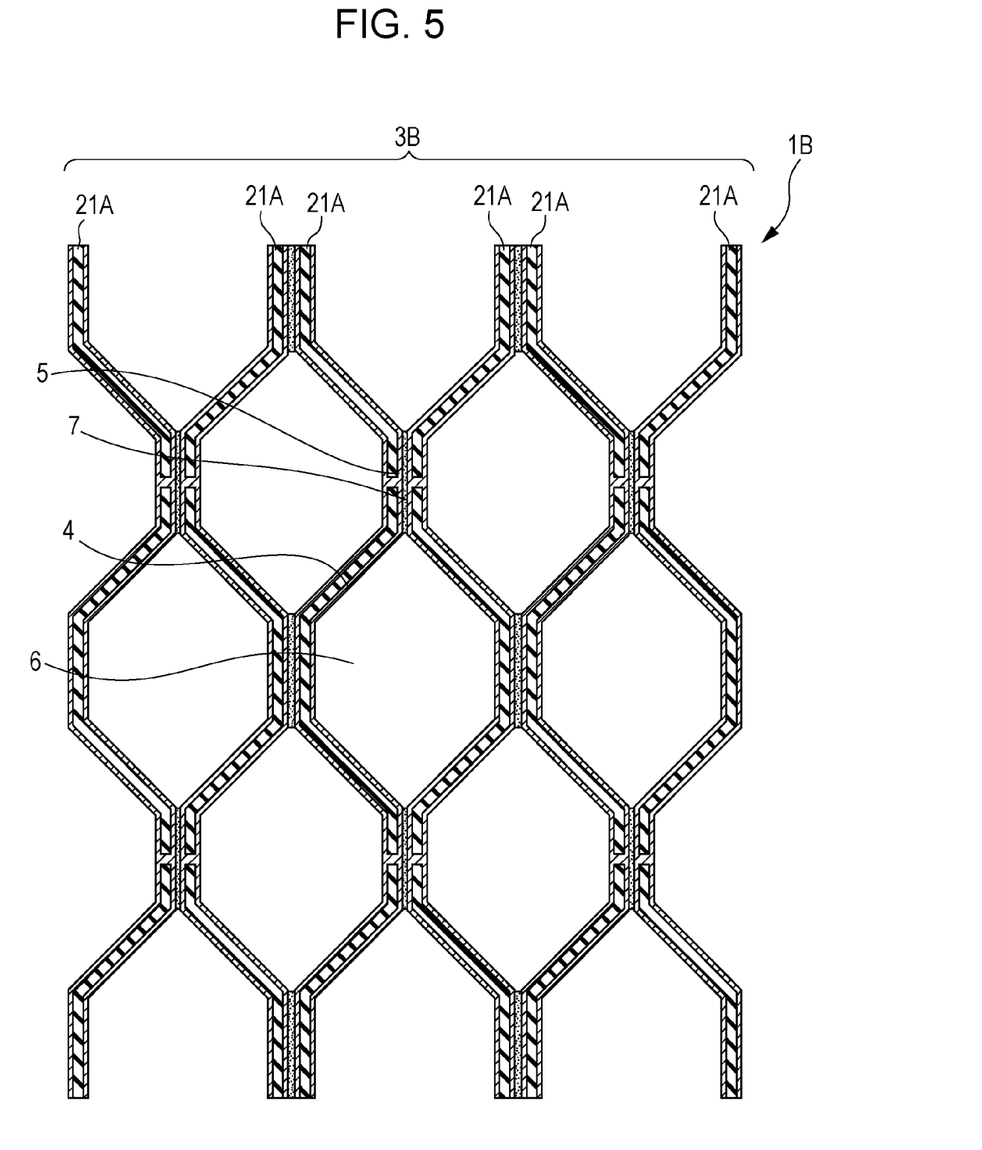
FIG. 5 is a partial schematic plan view of an elastic flexible substrate of a third embodiment of the present disclosure.
Figure 6:
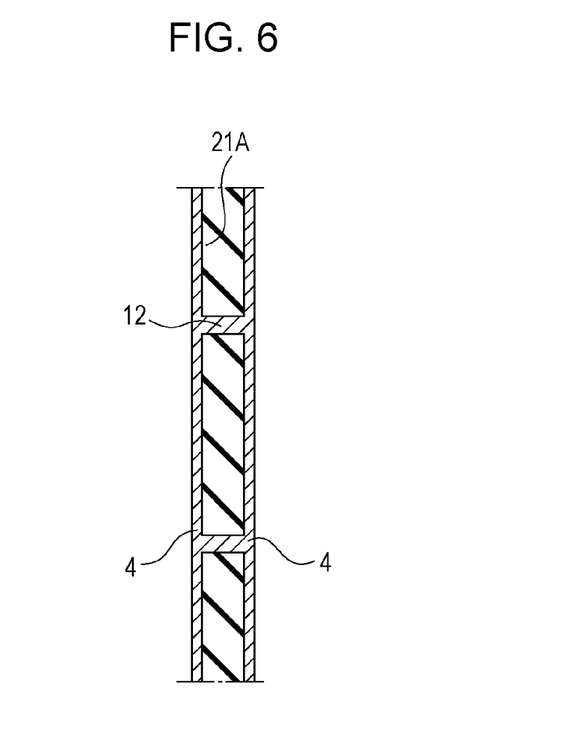
FIG. 6 is an enlarged schematic plan view of an insulating film with a wire.

FIG. 5 is a partial schematic plan view of the elastic flexible substrate 1B of the third embodiment of the present disclosure. FIG. 6 is an enlarged schematic plan view of an insulating film 21A with the wire 4.

The elastic flexible substrate 1B of the third embodiment of the present disclosure is different from the first embodiment in that the elastic flexible substrate 1B is configured with an insulating base material 3B configured with insulating films different from the insulating films in the first embodiment. The elastic flexible substrate 1B is, however, similar to the first embodiment in that a plurality of insulating films 21A are bonded such that the bonding portions 5 between adjacent insulating films are staggered. As illustrated in FIG. 5, in the plurality of insulating films 21A forming the insulating base material 3B, the wires 4 are disposed on the inner and outer principal surfaces of each insulating film 21A.

In the third embodiment, in the insulating film 21A, the wires 4 formed on both principal surfaces are connected through a through connection via 12 provided to penetrate the insulating film 21A, as illustrated in FIG. 6. That is, the wire 4 disposed on one principal surface is connected to one end of the through connection via 12, and the wire 4 disposed on the other principal surface is connected to the other end of the through connection via 12. This can make an electrical connection between the wires 4 disposed on both principal surfaces.

The above elastic flexible substrates of the first to third embodiments are configured with a plurality of insulating films. However, the present disclosure is not limited to this; for example, instead of splitting the plurality of insulating films in the first embodiment, a single long insulating base material 3 may be bent and folded more than once, thereby forming bonding portions 5 between adjacent portions of the insulating base material 3 as in the first embodiment or the like.

The elastic flexible substrate of the present disclosure may be configured by retaining, for example, any of the insulating base materials described in the first to third embodiments within an insulating member. Any insulating member may be used, provided that the insulating member has an insulating property and an expandable or contractible property. Examples of the insulating member include a silicone resin, urethane based resin, vinyl resin, styrene resin, and the like. For example, a silicone resin, which has an excellent expandable or contractible property, may be used. For example, if an insulating base material is retained within an insulating member, part of the wire 4 may be exposed from the insulating member. An electronic device may further be disposed on the wire 4 disposed on the insulating base material 3. There is no specific limitation on location where sensor elements are arranged. To improve connection reliability, however, the sensor elements can be arranged in the film bonding portions 5 that are less susceptible to stress change when the substrate is expanded/contracted. For example, the insulating base material 3 is preferably transparent to visible light.

The "electronic device" here generally forms an electronic component. Therefore, any type of electronic device may be used, provided that the electronic device is an electronic component for use in general flexible substrate fields. For example, the electronic device may be a semiconductor device, sensor that detects temperature and pressure, or actuator.

The "semiconductor device" here substantially means a luminescence element, light-receiving element, diode, transistor, and the like. If a luminescence element is used, a highly expandable or contractible display can be realized. If an actuator is used, a massage cloth capable of vibrating any point can be realized. Other specific examples of the electronic device may include an IC (control IC, for example), inductor, capacitor, power device, chip resistor, chip capacitor, chip varistor, chip thermistor, any other chip-like multilayer filter, connection terminal, and the like.

<Elastic Flexible Substrate Manufacturing Method of the Present Disclosure>

An elastic flexible substrate manufacturing method of one embodiment of the present disclosure will now be described.

The manufacturing method of the first embodiment for the elastic flexible substrate 1 of the present disclosure will first be described. The elastic flexible substrate 1 of the present disclosure may be manufactured through steps below. It should be noted that the insulating films 2 for use in this embodiment are components of the insulating base material 3.

(Step of Disposing a Wire on an Insulating Film)

First, dispose the wire 4 on one principal surface of the planar insulating film 2.

(Step of Making a Plurality of Insulating Films Mutually Opposed)

Figure 7:
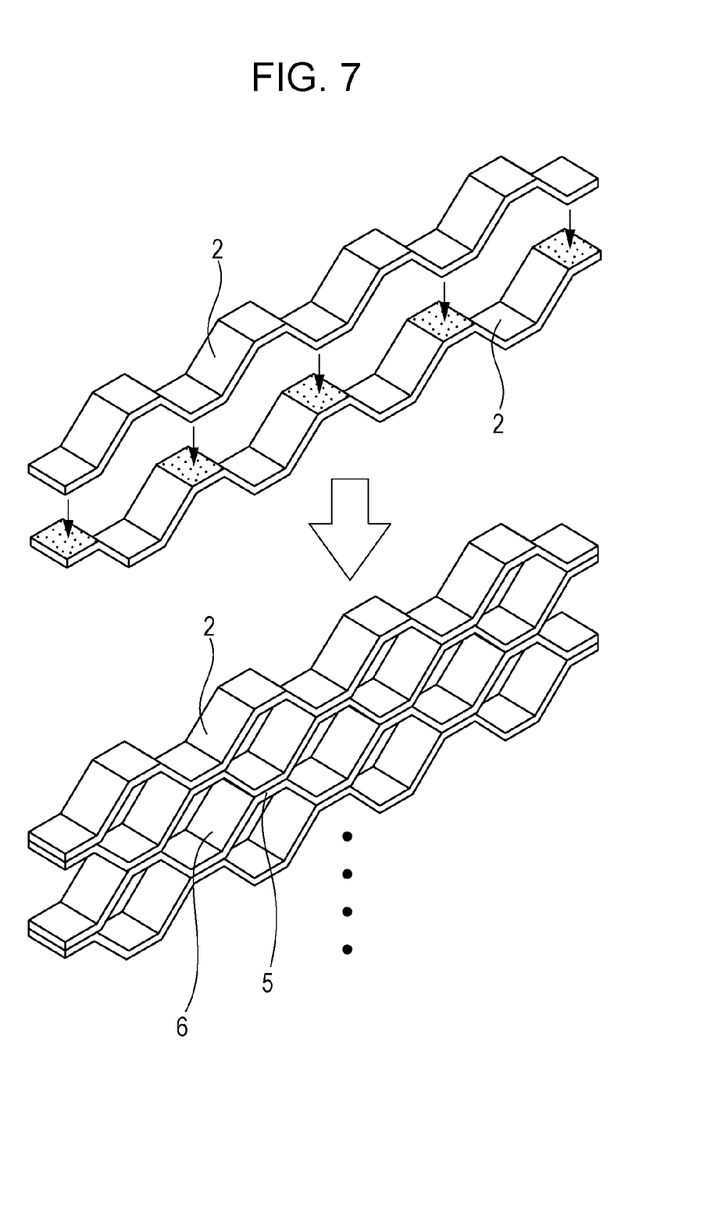
FIG. 7 illustrates a manufacturing method of the first embodiment for the elastic flexible substrate of the present disclosure.

Next, as illustrated in the upper diagram of FIG. 7, make the plurality of insulating films 2 with the wires 4 mutually opposed.

(Step of Forming Bonding Portions)

Next, as illustrated in the lower diagram of FIG. 7, "surface-bond" at least two mutually opposed insulating films 2 with the wires, at a plurality of places at intervals, thereby forming the bonding portions 5. The wires are omitted in FIG. 7. The opening 6 is formed between each pair of bonding portions 5 at that time. In any bonding portion 5, the wires disposed on adjacent insulating films 2 may be brought into mutual contact and electrically connected. The elastic flexible substrate 1 of one embodiment of the present disclosure is thus obtained. In the above manufacturing method of the first embodiment, instead of using the slender insulating films 2, a large-sized insulating film may be used in which a plurality of insulating films 2 are integrated. Wires corresponding to the individual insulating films 2 may be formed, portions of the large-sized insulating film may be opposed to each other to form bonding portions 5 at desired places, and then the insulating film may be split, thereby obtaining individual elastic flexible substrates 1 of the present disclosure.

The manufacturing method of the second embodiment for the elastic flexible substrate of the present disclosure will next be described.

The elastic flexible substrate 1A of the present disclosure may be manufactured through steps below.

(Step of Disposing a Wire on an Insulating Base Material)

First, dispose the wire 4 on one principal surface of the insulating film 22a or 21b.

(Step of Bending the Insulating Base Material with the Wire)

As illustrated in FIG. 4A, the insulating film 22a is a ribbon-shaped insulating film having the wire 4 disposed on the first principal surface 81, a constant width, and a length that is sufficiently long in a longitudinal direction with respect to the width. The insulating film 22a is folded along the center line orthogonal to the longitudinal direction while the second principal surface 82 opposed to the first principal surface 81 faces inward, and the opposed portions of the second principal surface 82 are bonded together through the adhesive layer 11. As illustrated in FIG. 4B, the insulating film 21b is a ribbon planar insulating film, which is folded along the center line parallel to a longitudinal direction while the second principal surface 82 opposed to the first principal surface 81 faces inward, and the opposed portions of the second principal surface 82 are bonded together through the adhesive layer 11.

(Step of Forming Bonding Portions)

Next, as in the upper diagram of FIG. 7, make the plurality of insulating films 22a or 21b with the wires mutually opposed.

Next, as in the lower diagram of FIG. 7, "surface-bond" at least two mutually opposed insulating films 22a or 21b with the wires, at a plurality of places at intervals, thereby forming the bonding portions 5. The wires 4 are omitted in FIG. 7. The opening 6 is formed between each pair of bonding portions 5 at that time. In any bonding portion 5, the wires 4 disposed on adjacent insulating films 22a or 21b are brought into mutual contact and electrically connected. The elastic flexible substrate 1A of one embodiment of the present disclosure is thus obtained.

Although the elastic flexible substrate of one embodiment of the present disclosure and the manufacturing method thereof have been described above, the present disclosure is not limited to this; it will be understood that various modifications may be made by those skilled in the art without departing from the scope of the disclosure defined in the following claims.

Example

An example using an elastic flexible substrate of one embodiment of the present disclosure will now be described. Specifically, a description is given of an embodiment in which an electrical-resistance strain gauge is connected to the elastic flexible substrate 1A of the second embodiment of the present disclosure so as to form a passive matrix.

Figure 8:
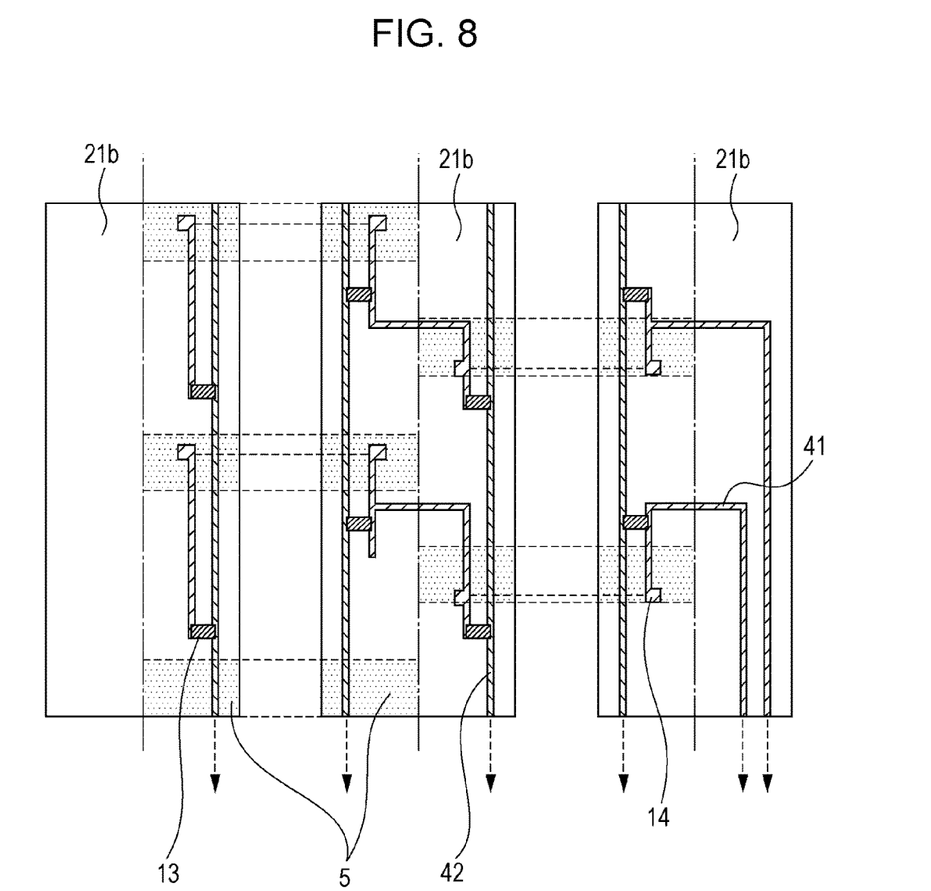
FIG. 8 illustrates an embodiment in which an electrical-resistance strain gauge is connected to the elastic flexible substrate of the second embodiment of the present disclosure so as to form a passive matrix.

First, as illustrated in FIG. 8, an X-direction wire 41 and a Y-direction wire 42 were disposed on one principal surface of each of three planar polyimide films (dimensions: 10 mm×100 mm×thickness of 50 μm) to be used as the insulating films 21b. A strain gauge and a diode were disposed as electronic devices 13 on the wires disposed in the X- and Y-directions. Then, each polyimide film was bent with the other principal surface of the polyimide film facing inward, and the opposed portions of the other principal surface of the polyimide film were bonded together by an adhesive.

Next, the three polyimide films with the X-direction wires 41 and the Y-direction wires 42 were made mutually opposed. Then, the three mutually opposed polyimide films with the X-direction wires 41 and the Y-direction wires 42 were surface-bonded at a plurality of places at intervals, thereby forming the bonding portions 5. The opening 6 was then formed between each pair of bonding portions 5. In each bonding portion 5, the wires 4 disposed on adjacent polyimide films were electrically connected through an electrode pad 14. At that time, to improve connection reliability, the electrode pad was bonded using a conductive adhesive.

The electrical-resistance strain gauge was thus electrically connected to the elastic flexible substrate 1A of the second embodiment of the present disclosure so as to form a passive matrix.

The present disclosure includes the following aspects.

A flexible substrate of one aspect of the present disclosure includes an insulating base material and a wire disposed on the insulating base material. The insulating base material has a plurality of bonding portions that are surface-bonded, and openings are formed between the bonding portions.

According to the above aspect, in the elastic flexible substrate of the present disclosure, an insulating film base material, which is a component of the elastic flexible substrate, includes a plurality of bonding portions that are "surface-bonded" and openings are formed between the bonding portions. Therefore, an expanding/contracting direction is not limited to one direction and a twist does not occur.

For example, in the elastic flexible substrate of the above aspect, the insulating base material may be configured with a plurality of insulating films. In the plurality of bonding portions, one of the adjacently arranged insulating films and the other insulating film may be bonded at a plurality of places at intervals.

For example, in the elastic flexible substrate of the above aspect, the bonding portions may be surface-bonded through an adhesive.

For example, in the elastic flexible substrate of the above aspect, the insulating base material may have two principal surfaces, the insulating base material may include the wire on each of the two principal surfaces, and the wire disposed on one principal surface of the two principal surfaces and the wire disposed on the other principal surface may be interconnected through a connection via provided in the insulating base material.

For example, in the elastic flexible substrate of the above aspect, the insulating base material may have a first principal surface and a second principal surface, the insulating base material may include the wire on the first principal surface, and the insulating base material may be bent with the second principal surface facing inward, thereby bonding the opposed portions of the second principal surface through an adhesive layer.

For example, in the elastic flexible substrate of the above aspect, the insulating base material may be bent along a longitudinal direction of the insulating base material or a direction orthogonal to the longitudinal direction.

For example, the elastic flexible substrate of the above aspect may further include a second wire, in the elastic flexible substrate of the above aspect, the wire and the second wire may be electrically connected in the bonding portions.

For example, in the elastic flexible substrate of the above aspect, the bonding portions may serve as partitions that divide the adjacent openings.

For example, in the elastic flexible substrate of the above aspect, the wire arranged in a first direction and the wire arranged in a second direction that is different from the first direction may be disposed on the insulating base material.

For example, in the elastic flexible substrate of the above aspect, an electronic device may be disposed on the wire, and the electronic device may be electrically connected to the wire.

For example, in the elastic flexible substrate of the above aspect, the electronic device may be at least one selected from the group consisting of a semiconductor device, a sensor element, and an actuator.

For example, in the elastic flexible substrate of the above aspect, the insulating base material may be transparent to visible light.

An elastic flexible substrate manufacturing method according to another aspect of the present disclosure includes (i) disposing a wire on an insulating base material and (ii) forming bonding portions that are surface-bonded at a plurality of places at intervals in the insulating base material with the wire.

For example, the elastic flexible substrate manufacturing method according to the above aspect may further include bending the insulating base material with the wire between the steps of (i) and (ii).

For example, in the elastic flexible substrate manufacturing method according to the above aspect, at the step of (ii), mutually opposed portions of the bent insulating base material with the wire may be surface-bonded at intervals.

For example, the elastic flexible substrate manufacturing method according to the above aspect may further include making a plurality of insulating films forming the insulating base material mutually opposed and surface-bonding one of the adjacent insulating films and the other insulating film at a plurality of places at intervals.

For example, in the elastic flexible substrate manufacturing method according to the above aspect, an opening may be formed between the bonding portions.

For example, in the elastic flexible substrate manufacturing method according to the above aspect, the wires disposed on the insulating base material may be brought into mutual contact and electrically connected in the bonding portions.

For example, in the elastic flexible substrate manufacturing method according to the above aspect, at the step of (i), the wires disposed on both principal surfaces of the insulating base material may be interconnected using a connection via.

For example, in the elastic flexible substrate manufacturing method according to the above aspect, at the step of (i), the wire may be disposed on a first principal surface of the insulating base material, the insulating base material may be bent with a second principal surface of the insulating base material facing inward, and then mutually opposed portions of the second principal surface of the insulating base material may be bonded together using an adhesive.

The elastic flexible substrate of the present disclosure can be used as an expandable or contractible circuit board.

What is claimed is:

1. An elastic flexible substrate comprising:
    a base made of insulating material, the insulating base having a first insulating film and a second insulating film, and
    a plurality of wires, each of which is disposed on one of the first insulating film or the second insulating film, wherein:
    the first insulating film and the second insulating film have a plurality of bonding portions where the first insulating film and the second insulating film are surface-bonded to one another,
    each of the plurality of wires being disposed in at least one of the plurality of bonding portions;
    a plurality of openings are formed by the first insulating film, the second insulating film and the bonding portions, each of the plurality of openings being wholly enclosed by the first insulating film, the second insulating film and the bonding portions when viewed in plan, and
    two of the plurality of wires are electrically connected in the bonding portions.

2. The elastic flexible substrate according to claim 1, wherein:
    in the plurality of bonding portions, the first insulating film and the second insulating film are bonded at a plurality of places at intervals.

3. The elastic flexible substrate according to claim 1, wherein the bonding portions are surface-bonded through an adhesive.

4. The elastic flexible substrate according to claim 1, wherein:
    the first insulating film has two principal surfaces;
    one of the plurality of wires are disposed on each of the two principal surfaces; and
    the wire disposed on one principal surface of the two principal surfaces and the wire disposed on the other principal surface are interconnected through a connection via provided in the first insulating film.

5. The elastic flexible substrate according to claim 1, wherein:
    the first insulating film has a first principal surface and a second principal surface;

the first insulating film has one of the plurality of wires disposed on the first principal surface; and the first insulating film is bent with the second principal surface facing inward, thereby bonding opposed portions of the second principal surface through an adhesive layer.

6. The elastic flexible substrate according to claim 1, wherein the bonding portions serve as partitions that divide the adjacent openings.

7. The elastic flexible substrate according to claim 1, wherein a first wire of the plurality of wires which is disposed of the first insulating film is arranged in a first direction and a second wire of the plurality of wires which is disposed of the second insulating film is arranged in a second direction that is different from the first direction.

8. The elastic flexible substrate according to claim 1, wherein:
an electronic device is disposed on at least one of the plurality of wires; and
the electronic device is electrically connected to the at least one of the plurality of wires.

9. The elastic flexible substrate according to claim 1, wherein the insulating base is transparent to visible light.

10. The elastic flexible substrate according to claim 5, wherein the first insulating film is bent along a longitudinal direction of the first insulating film or a direction orthogonal to the longitudinal direction.

11. The elastic flexible substrate according to claim 8, wherein the electronic device is at least one selected from the group consisting of a semiconductor device, a sensor element, and an actuator.

12. An elastic flexible substrate manufacturing method comprising:
(i) forming a base made of insulating material, the insulating base having a first insulating film and a second insulating film;
(ii) disposing a first wire on the first insulating film and disposing a second wire on the second insulating film; and
(iii) forming bonding portions where the first insulating film and the second insulating film are surface-bonded to one another,
wherein the first wire and the second wire are disposed in at least one of the plurality of bonding portions;
a plurality of openings are formed by the first insulating film, the second insulating film and the bonding portions, each of the plurality of openings being wholly enclosed by the first insulating film, the second insulating film and the bonding portions when viewed in plan, and
the first wire and the second wire are electrically connected in the bonding portions.

13. The elastic flexible substrate manufacturing method according to claim 12, further comprising:
bending the first insulating film and the second insulating film between the steps of (ii) and (iii).

14. The elastic flexible substrate manufacturing method according to claim 12, wherein the first wire disposed on the first insulating film and the second wire disposed on the second insulating film are brought into mutual contact and electrically connected in the bonding portions.

15. The elastic flexible substrate manufacturing method according to claim 12, wherein the first insulation film has two principal surfaces, the first wire is disposed on one of the principal surfaces and another wire is disposed on the other principal surface, the first wire and the another wire are interconnected through a connection via provided in the first insulating film.

16. The elastic flexible substrate manufacturing method according to claim 12, wherein the first wire is disposed on a first principal surface of the first insulating film, the first insulating film is bent with a second principal surface of the first insulating film facing inward, and then mutually opposed portions of the second principal surface of the first insulating film are bonded together using an adhesive.

17. The elastic flexible substrate manufacturing method according to claim 13, wherein, at the step of (iii), mutually opposed portions of the bent first insulating film and the bent second insulating film are surface-bonded at intervals.

18. An elastic flexible substrate comprising:
a base made of insulating material, the insulating base having a first insulating film and a second insulating film, and
a plurality of wires, each of which is disposed on one of the first insulating film or the second insulating film,
wherein:
the first insulating film and the second insulating film have a plurality of bonding portions where the first insulating film and the second insulating film are surface-bonded to one another,
each of the plurality of wires being disposed in at least one of the plurality of bonding portions;
a plurality of openings are formed by the first insulating film, the second insulating film and the bonding portions, each of the plurality of openings being wholly enclosed by the first insulating film, the second insulating film and the bonding portions when viewed in plan, and
the bonding portions serve as partitions that divide the adjacent openings.

* * * * *